United States Patent [19]
Giacomini

[11] Patent Number: 6,121,839
[45] Date of Patent: Sep. 19, 2000

[54] CLASS AB CMOS OUTPUT STAGE FOR OPERATIONAL AMPLIFIER

[75] Inventor: Davide Giacomini, Valdengo, Italy

[73] Assignee: STMicroelectronics S.r.l., Agrate Brianza, Italy

[21] Appl. No.: 09/195,590

[22] Filed: Nov. 18, 1998

[30] Foreign Application Priority Data

Nov. 19, 1997 [IT] Italy ................................. VA97A0036

[51] Int. Cl.[7] ....................................................... H03F 3/26
[52] U.S. Cl. ............................................. 330/264; 330/267
[58] Field of Search ..................................... 330/255, 264, 330/267, 263

[56] References Cited

U.S. PATENT DOCUMENTS 5,786,731 7/1998 Bales ........................................ 330/267
5,808,514 9/1998 Kolluri ..................................... 330/267

FOREIGN PATENT DOCUMENTS 0041807 2/1991 Japan ....................................... 330/264

*Primary Examiner*—Steven J. Mottola
*Attorney, Agent, or Firm*—Theodore E. Galanthay; Allen, Dyer, Doppelt, Milbrath & Gilchrist, P.A.

[57] ABSTRACT

A class AB CMOS output stage for an operational amplifier with a rail-to-rail output swing includes a pair of complementary control transistors connected in opposing phase to each other. Connection of the complementary control transistors is made between driving nodes of a pair of complementary output transistors driven by a differential signal. The differential signal is provided by a pair of differential signal input lines connected to an input stage of the operational amplifier. Biasing of the pair of complementary control transistors is by the differential signal.

22 Claims, 3 Drawing Sheets

CLASS AB CMOS OUTPUT STAGE FOR OPERATIONAL AMPLIFIER

FIELD OF THE INVENTION

The present invention relates to the field of operational amplifiers, and more particularly, to an output stage of a CMOS operational amplifier.

BACKGROUND OF THE INVENTION

A circuit widely used in analog systems for amplifying signals superimposed on a variable continuous component reaching voltage levels close to the supply lines is a rail-to-rail operational amplifier. When it is no longer possible to use a common output stage, more complex circuit approaches become necessary. The amplifier must be able to handle an input signal having an amplitude equal to the voltage difference between the two supply rails, while providing an output signal having an amplitude that may equal such a voltage difference. There is a wealth of approaches described in the prior art which address certain known problems, but nonetheless, these approaches often have well-recognized drawbacks.

To better illustrate an approach for these known problems, and the advantages provided by the circuit of the invention, it is useful to refer to a circuit described in the IEEE Journal of Solid State Circuits, vol. 29, No. 12, December 1994, wherein a rail-to-rail amplifier for VLSI cells is disclosed. FIG. 1 shows an output stage in which the current generators may be formed with MOS transistors. The minimum supply voltage is equal to:

$$Vsuppmin = 2*Vgs(pch|nch) + Vds(sat)$$

By using 1 μm BiCMOS technology with voltage thresholds of 0.64V for the N-channel, and −0.75V for the P-channel, the minimum supply voltage will be Vsuppmin=2V. The maximum voltage determined by such a low voltage fabrication technology is 6V.

The lin1 and lin2 lines originate from the input stage, which is not shown in the figure because it is not essential for the following discussion. The two signal currents provided by lines lin1 and lin2 must be in phase with each other. If we assume that the signal current is flowing in, the current available to the complementary pair of control MOS transistors M4 and M5 will be increased on the high side transistor because of line lin1. For the low side transistor, the current is decreased because a portion is input along line lin2 by the input stage.

This condition induces a shift towards a higher potential for the pair of control MOS transistors for the class AB stage transistors M4 and M5. As the voltage at the source of transistor M5 increases while the voltage on its gate remains constant, the current flowing in transistor M5 decreases while the current flowing in transistor M4 increases. The gate voltage of transistor M4 remains constant while its source voltage increases. This causes a voltage increase on the gates at the output of MOS transistors M3 and M6.

Input currents lin1 and lin2 are the bias current generated by the respective I1 and I3 current generators. If the input currents lin1 and lin2 become equal, the current through the control transistors M4 and M5 become null and the gate voltages of transistors M3 and M6 will be different only by a saturation Vds voltage of the transistor M4. In this case, transistor M6 is turned on at the maximum possible Vgs voltage, which is given by:

$$Vgs(max) = Vdd - 2*Vds(sat)$$

M5 is turned off at the lowest possible Vgs voltage, which is given by:

$$Vgs(min) = Vds(sat)$$

This condition is also duplicated when the two signal currents on lines lin1 and lin2 are flowing out of the output stage. Hence, the two turn on voltages Vds(sat) for both the output MOS transistors M3 and M6 are nearly saturated. Such a voltage could become very useful when the supply voltage decreases, i.e., in applications intended to function at relatively low voltages.

SUMMARY OF THE INVENTION

The present invention provides for an improved class AB CMOS output stage for an operational amplifier, with rail-to-rail dynamics, and that is particularly advantageous in low supply voltage applications. This result is achieved with an output stage without bias current generators. Bias is provided by current mirrors of the signal currents themselves. This avoids problems related to nonideal matching among current generators, and the consequent introduction of imprecisions due to offset voltages.

Bias of a complementary pair of control transistors for the class AB output stage is derived from the differential signal input lines lin1 and lin2 connected to the output stage from the input stage of the operational amplifier. The bias is represented by a pair of differential signal currents in opposing phase to each other.

BRIEF DESCRIPTION OF THE DRAWINGS

The different aspects and advantages of the circuit of the invention will become clearer through the following detailed description of a particular preferred embodiment, and by referring to the annexed drawings wherein.

DETAILED DESCRIPTION OF THE PREFERRED EMBODIMENTS

Figure 1:
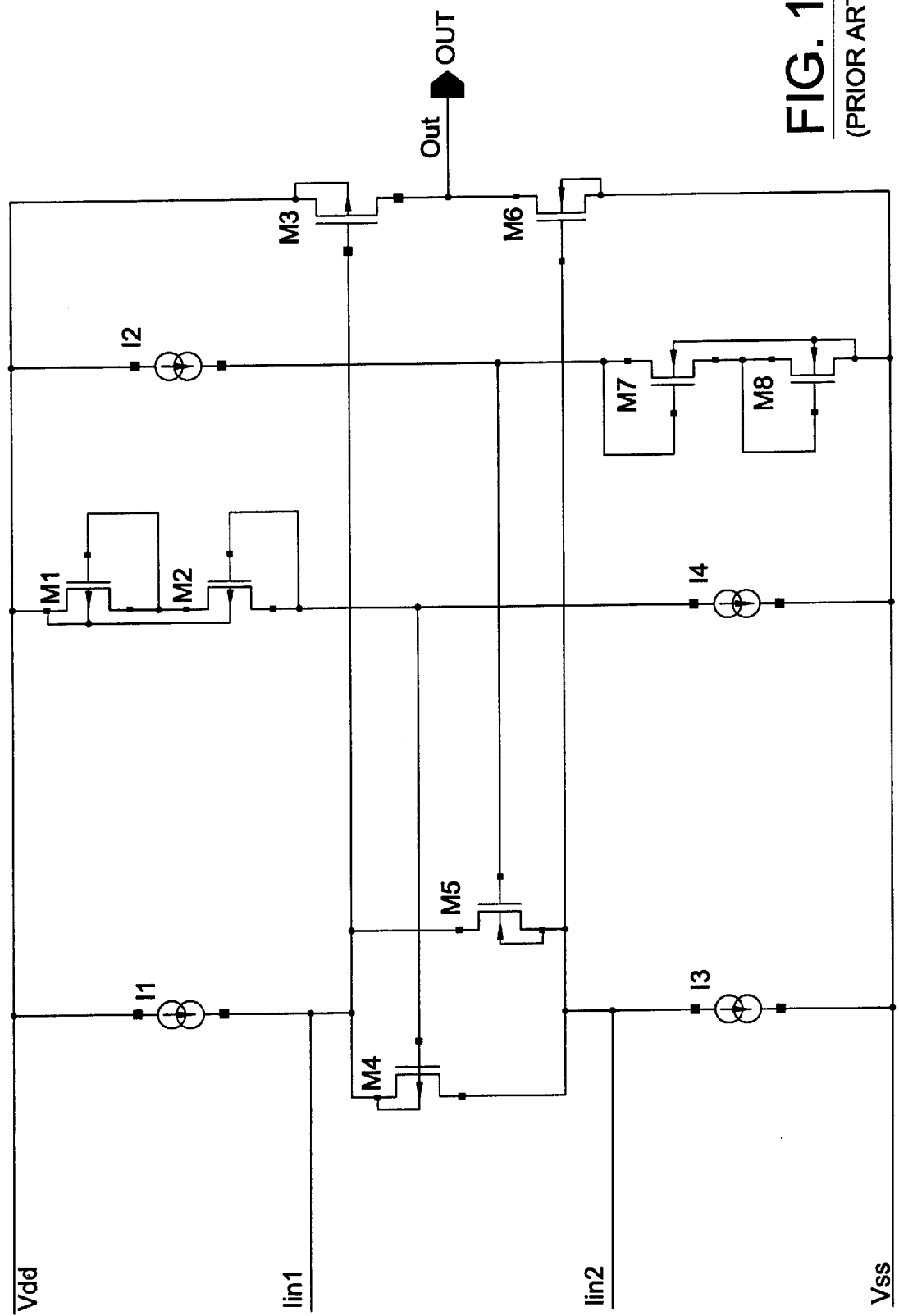
FIG. 1 shows the circuit diagram of the output stage of a rail-to-rail operational amplifier, according to the prior art.
Figure 2:
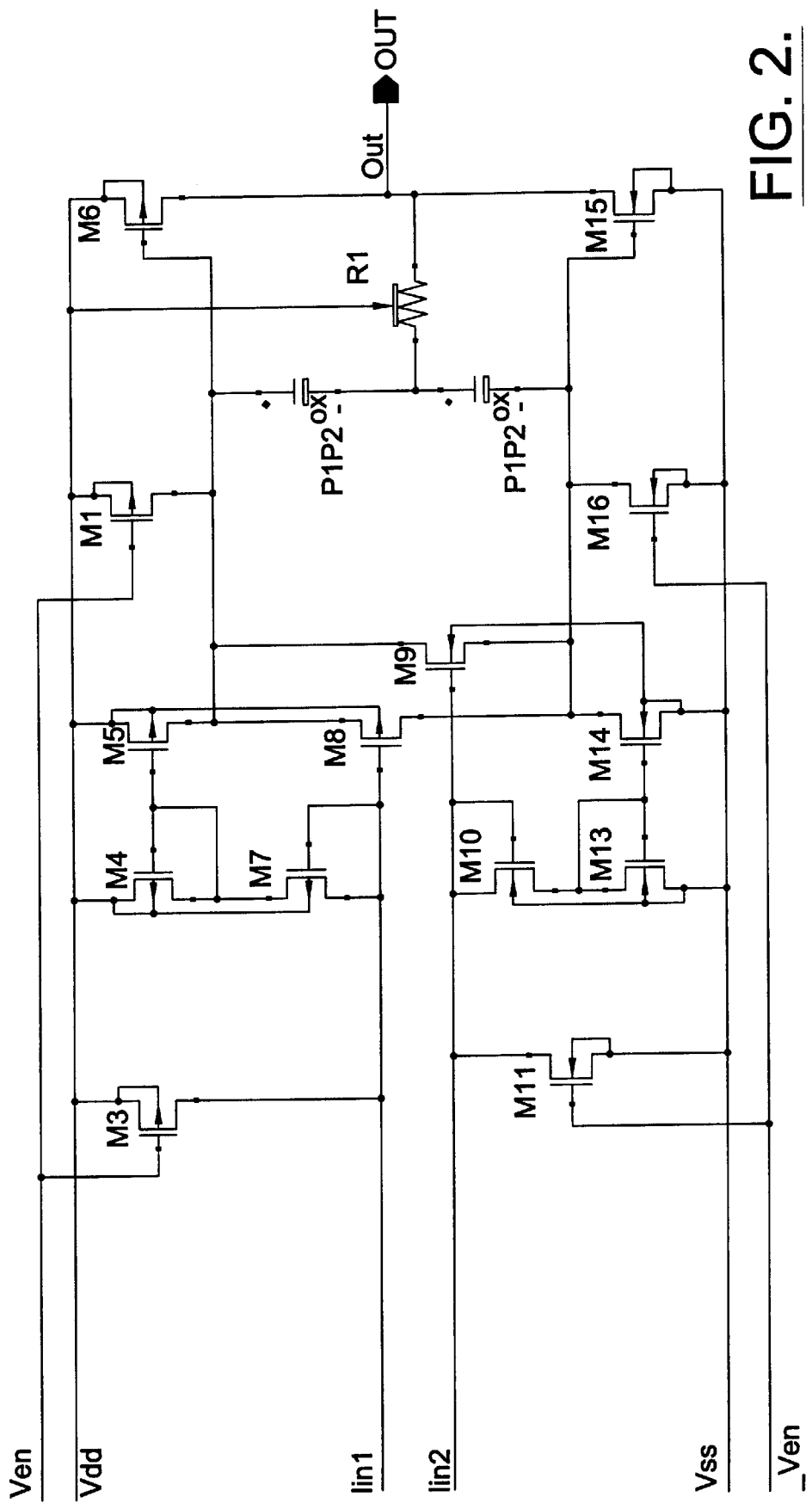
FIG. 2 shows a circuit diagram of an output stage of an operational amplifier, according to the present invention.

FIG. 2 shows the circuit diagram of a class AB output stage, according to a preferred embodiment of the present invention. Operation of the circuit of the invention requires that the differential signal currents, lin1 and lin2, be in opposing phase to each other. This is contrary to that required by the prior art output stage of the rail-to-rail operational amplifier illustrated in FIG. 1.

The MOS transistors M4, M7 and M8 are operatively equivalent to the MOS transistors M1, M2 and M4 of the prior art circuit shown in FIG. 1. However, the diode pair M4, M7 are not biased by a constant current generated by a dedicated current generator. On the contrary, the diode pair M4, M7 are biased by the differential signal currents themselves. Furthermore, the source of the transistor M8 is not connected to a current generator, but rather to a MOS transistor M5 which mirrors the differential signal current. The same may be said for the circuit portion comprising the transistors M10, M13, M9 and M14, which is symmetrically complementary.

In analyzing the function of signal currents lin1 and lin2, if lin1 increases, i.e., the injected current increases, while lin2 decreases, i.e., less current is injected, the potential level of the complementary pair of control transistors M8, M9 shifts higher. This occurs when the current output provided by transistor M5 is greater than the current absorbed by transistor M14. The capacity of absorbing current for transistor M9 decreases, and the capacity of absorbing current for transistor M8 increases so that it is always more conductive because its Vgs increases. As a consequence, the gate voltages of both the output transistors M6, M15 rise.

In this case, saturation of M8 is reached when it is no longer able to absorb more current from transistor M14 because lin2 has become null. Even in this case, the maximum turn on voltage of transistor M15 is equal to $$Vgs(max)=Vdd-2*Vds(sat)$$

while the minimum turn off voltage of M6 is $$Vgs(min)=Vds(sat).$$

Therefore, the circuit of the invention retains the functional characteristics of the prior art circuit of FIG. 1, while being more compact and having a more easily controlled offset. In particular, there are no current generators to bias the differential stage components that would need to be accurately matched to avoid offset errors, as in the prior art circuit. By not counting the MOS transistors M3, M1, M11 and M16 included in the diagram of FIG. 2, the essential functional diagram comprises ten transistors while the prior art circuit of FIG. 1 requires a minimum of twelve transistors. The twelve transistors are calculated by considering that each bias current generator is implemented with at least one MOS transistor. The current generators used in the prior art circuit introduce noise originating from the supply lines, or from their bias lines. In contrast, the circuit of the invention as shown in FIG. 2 does not require any current generators because it draws the necessary bias current from the signal lines lin1 and lin2.

Figure 3:
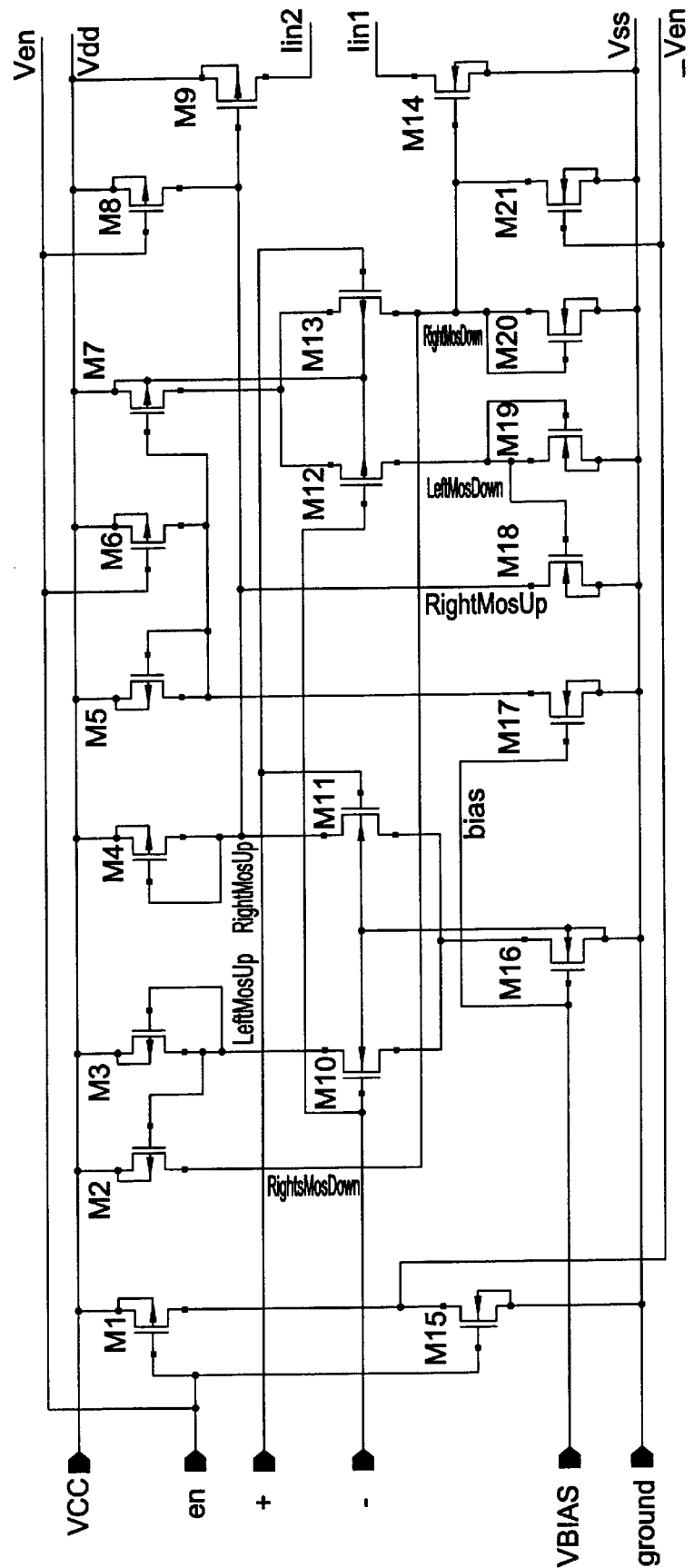
FIG. 3 shows an input stage for an operational amplifier for driving an output stage of an operational amplifier, according to the present invention.

Referring to FIG. 3, a circuit diagram of an input stage suitable for driving the class AB class output stage of the invention is illustrated. There are two N-channel and P-channel differential pairs that also have a double input compatibility. The reference indications for the transistors forming the input stage of FIG. 3 are progressive. The same reference indications used for illustrating the output stage circuits of FIGS. 1 and 2 are repeated.

That which is claimed is:

1. A class AB CMOS output stage for an operational amplifier having a rail-to-rail output voltage swing, the output stage comprising:
   a pair of complementary output transistors;
   a pair of differential signal lines for providing differential signal currents being in opposing phase to each other;
   a pair of complementary control transistors connected in opposing phase to each other between driving nodes of said pair of complementary output transistors, a gate of a respective transistor of said pair of complementary control transistors connected to a respective differential signal line of said pair of differential signal lines; and
   biasing means for biasing said pair of complementary control transistors, said biasing means comprising
      a pair of first and second diodes connected in series between a respective supply line and a respective differential signal line of the pair of differential signal lines, and
      a first transistor connected to the first diode of a respective pair of diodes forming a current mirror for mirroring a differential signal current for the respective transistor of said pair of complementary control transistors, and to a terminal of the second diode of said pair of diodes.

2. A class AB CMOS output stage according to claim 1, further comprising control means responsive to logic signals for enabling/disabling said pair of complementary output transistors.

3. A class AB CMOS output stage according to claim 2, wherein said control means comprises:
   a second transistor having a source and drain respectively connected between the respective supply line and the respective differential signal line of said pair of differential signal lines, and having a gate for receiving a respective logic signal; and
   a third transistor having a source and drain respectively connected between the respective supply line and a gate of the respective transistor of said pair of complementary output transistors, and having a gate for receiving the respective logic signal.

4. A class AB CMOS output stage according to claim 1, wherein each diode comprises a diode-connected transistor.

5. An output stage for an operational amplifier comprising:
   a pair of complementary output transistors;
   a pair of differential signal lines for providing differential signal currents being in opposing phase to each other;
   a pair of complementary control transistors having respective conduction terminals connected in parallel between driving nodes of said pair of complementary output transistors, a control terminal of a respective transistor of said pair of complementary control transistors connected to a respective differential signal line of said pair of differential signal lines; and
   a biasing circuit for biasing said pair of complementary control transistors.

6. An output stage according to claim 5, wherein said biasing therefor comprises:
   a pair of first and second diodes connected in series between a respective supply line and a respective differential signal line of the pair of differential signal lines; and
   a first transistor connected to the first diode of a respective pair of diodes forming a current mirror for mirroring a differential signal current for the respective transistor of said pair of complementary control transistors, and to a terminal of the second diode of said pair of diodes.

7. An output stage according to claim 5, further comprising a control circuit responsive to logic signals for enabling/disabling said pair of complementary output transistors.

8. An output stage according to claim 7, wherein said control circuit comprises:
   a second transistor having conduction terminals connected between the respective supply line and the respective differential signal line of said pair of differential signal lines, and having a control terminal for receiving a respective logic signal; and
   a third transistor having conduction terminals connected between the respective supply line and a control terminal of the respective transistor of said pair of complementary output transistors, and having a control terminal for receiving the respective logic signal.

9. An output stage according to claim 5, wherein the operational amplifier is a class AB amplifier.

10. An output stage according to claim 5, wherein the operational amplifier is formed using CMOS technology.

11. An output stage according to claim 6, wherein each diode comprises a diode-connected transistor.

12. An operational amplifier comprising:

an input stage;

a pair of differential signal lines connected to said input stage for providing differential signal currents being in opposing phase to each other; and an output stage connected to said pair of differential signal lines, said output stage comprising
a pair of complementary output transistors,
a pair of complementary control transistors having respective conduction terminals connected in parallel between driving nodes of said pair of complementary output transistors, a control terminal of a respective transistor of said pair of complementary control transistors connected to a respective differential signal line of said pair of differential signal lines, and
a biasing circuit for biasing said pair of complementary control transistors.

13. An operational amplifier according to claim 12, wherein said biasing circuit comprises:

a pair of first and second diodes connected in series between a respective supply line and a respective differential signal line of the pair of differential signal lines; and a first transistor connected to the first diode of a respective pair of diodes forming a current mirror for mirroring a differential signal current for the respective transistor of said pair of complementary control transistors, and to a terminal of the second diode of said pair of diodes.

14. An operational amplifier according to claim 12, further comprising a control circuit responsive to logic signals for enabling/disabling said pair of complementary output transistors.

15. An operational amplifier according to claim 14, wherein said control circuit comprises:

a second transistor having conduction terminals respectively connected between the respective supply line and the respective differential signal line of said pair of differential signal lines, and having a conduction terminal for receiving a respective logic signal; and a third transistor having conduction terminals respectively connected between the respective supply line and a conduction terminal of the respective transistor of said pair of complementary output transistors, and having a conduction terminal for receiving the respective logic signal.

16. An operational amplifier according to claim 12, wherein the operational amplifier is a class AB amplifier.

17. An operational amplifier according to claim 12, wherein the operational amplifier is formed using CMOS technology.

18. An operational amplifier according to claim 13, wherein each diode comprises a diode-connected transistor.

19. A method for biasing an output stage of an operational amplifier, the method comprising the steps of:

connecting a pair of complementary output transistors;

providing differential signal currents via a pair of differential signal lines, the differential signal currents being in opposing phase to each other;

connecting respective conduction terminals of a pair of complementary control transistors in parallel between driving nodes of the pair of complementary output transistors; and biasing the pair of complementary control transistors with the differential signal currents.

20. A method according to claim 19, wherein the step of biasing further comprising the steps of:

connecting a pair of first and second diodes in series between a respective supply line and a respective differential signal line of the pair of differential signal lines; and connecting a first transistor to the first diode of a respective pair of diodes forming a current mirror for mirroring a differential signal current for the respective transistor of the pair of complementary control transistors, and to a terminal of the second diode of said pair of diodes.

21. A method according to claim 18, further comprising the step of enabling/disabling the pair of complementary output transistors using a control circuit responsive to logic signals.

22. A method according to claim 19, wherein the operational amplifier is a class AB amplifier.

* * * * *

UNITED STATES PATENT AND TRADEMARK OFFICE
CERTIFICATE OF CORRECTION

PATENT NO.   : 6,121,839  
DATED        : September 19, 2000  
INVENTOR(S)  : Davide Giacmini Page 1 of 1

It is certified that error appears in the above-identified patent and that said Letters Patent is hereby corrected as shown below:

<u>Column 4:</u>
Line 41, delete "therefor" insert --circuit--

Signed and Sealed this

Twelfth Day of June, 2001

*Attest:*

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO.   : 6,121,839
DATED        : September 19, 2000
INVENTOR(S)  : Davide Giacomini It is certified that error appears in the above-identified patent and that said Letters Patent is hereby corrected as shown below:

<u>Column 4,</u>
Line 41, delete "therefor" insert -- circuit --

This certificate supercedes certificate of correction issued June 12, 2001

Signed and Sealed this

Twentieth Day of November, 2001

*Attest:*

NICHOLAS P. GODICI
*Attesting Officer*    *Acting Director of the United States Patent and Trademark Office*